United States Patent

Melchior

[11] Patent Number: 5,768,831
[45] Date of Patent: Jun. 23, 1998

[54] ROOFTILE SUPPORT FOR PHOTOCELL PANEL

[75] Inventor: Bernd Melchior, Wermelskirchen, Germany

[73] Assignee: Blue Planet AG, Schaan, Liechtenstein

[21] Appl. No.: 615,215

[22] PCT Filed: Sep. 3, 1994

[86] PCT No.: PCT/EP94/02943

§ 371 Date: Apr. 24, 1996

§ 102(e) Date: Apr. 24, 1996

[87] PCT Pub. No.: WO95/08194

PCT Pub. Date: Mar. 23, 1995

[30] Foreign Application Priority Data

Sep. 16, 1993 [DE] Germany .......................... 43 31 424.4
Sep. 16, 1993 [DE] Germany .......................... 43 31 425.2
Apr. 1, 1994 [DE] Germany .......................... 44 11 458.3

[51] Int. Cl.⁶ .......................... E04D 13/18; H01L 31/048
[52] U.S. Cl. .......................... 52/173.3; 52/519; 52/522; 136/244; 136/251; 136/291
[58] Field of Search .......................... 52/518, 519–173.3, 52/522, 541; 136/244, 251, 291

[56] References Cited

U.S. PATENT DOCUMENTS 5,022,381  6/1991  Allegro .......................... 52/173.3 X
5,112,408  5/1992  Melchior et al. .......................... 136/251
5,578,142  11/1996  Hattori et al. .......................... 136/251

FOREIGN PATENT DOCUMENTS

0 440 103-A2   8/1991   European Pat. Off. .
32 47 467-A    7/1984   Germany .
32 47 469-A    7/1984   Germany .
3830484        3/1989   Germany .......................... 136/251
3-124 070-A    5/1991   Japan .

Primary Examiner—Carl D. Friedman
Assistant Examiner—Yvonne Horton-Richardson
Attorney, Agent, or Firm—Milton Oliver

[57] ABSTRACT

The invention relates to a roof tile/roof slate/wall plate 1 made of a plate of clay, ceramic, concrete, fiber cement or synthetic, serving as a carrier for a solar panel 6 with photovoltaic solar cells 7 to be attached to its upper side where said solar panel 6 is attached form-fittingly to the upper side of the roof tile/roof slate/wall plate with at least two sides opposite to one another at the inner edges of a recess of a roof tile/roof slate/wall plate indent, and where the extensions 5, due to their own flexibility, are engaged in a snap-in manner particularly form-fittingly in recesses 4 of the roof tile/roof slate/wall plate indentation 2.

29 Claims, 7 Drawing Sheets

ROOFTILE SUPPORT FOR PHOTOCELL PANEL

The invention relates to roof tile/roof slate/wall plate made of a plate of clay, ceramic, concrete, fiber cement or synthetic, serving as a carrier for a solar panel with photovoltaic solar cells attached on the upper side. The solar panel is form-fittingly attached to the upper side of the roof tile/roof slate/wall plate with at least two sides opposite to one another at the inner edges of an indent of a roof tile/roof slate/wall plate.

European patent application EP 0 440 103 A2 discloses a solar panel attached to the upper side of a roof tile. The solar panel is attached form-fittingly such that the material of the roof tile/roof slate protrudes at least on two opposite sides such that it reaches over one area, particularly the edge of the solar panel which secures the solar panel from being lifted off. The solar panel is, particularly from above, pressed onto the roof tile and, due to its own flexibility, hooks into a recess of the roof tile.

It became apparent that roof tiles have liberal production tolerances making the fit of the solar panels insufficient; they are either seated too loosely on the roof tile or are too large to fit.

JP-A-31 24 070 discloses solar cells that are mounted in a common frame with metal hooks attached to the bottom of the solar cells such that the hooks engage in the frame. Due to this particular mounting method, the solar cells are protected from mechanical damage due to thermal expansion.

It is the object of the invention to improve a roof tile/roof slate/wall plate with solar panel such that the solar panel will always have a secure and precise hold without damaging the solar cells during installation, even with the liberal production tolerances.

This object is attained by the embodiment according to the invention.

The flexible extensions of the solar panel, protruding on the sides, can be fitted to the diverse deviations in dimensions providing always a secure and strong hold. In this manner, the solar panels will fit into the roof tile/roof slate/wall plate, even when the inside dimensions of the roof tile/roof slate/wall plate are significantly smaller than intended.

It is particularly advantageous if the recesses cover a length that is a fraction of the entire length of the inner edge. These recesses may be groove sections, longitudinal holes, pockets, and/or bore holes. The extensions should also be carried by a frame or built into, particularly joined to, a frame surrounding the solar cell(s).

It is most advantageous if the extensions protrude at the bottom side of the solar panel in a beveled downwards fashion.

In this manner, the extensions are located very low at the solar panel, finding support relatively low at the roof tile, thereby having the module itself seated high on the roof truss, allowing the upper surface of the solar panel to be in line with the upper surface of the roof tile, and thus avoiding dirt from depositing on the rims and extensions.

Secure sealing is achieved when a longitudinal rabbet profile protrudes to the side at the upper edge of the frame and butts tightly with the roof tile/roof slate/wall plate.

A particularly tight hold of the solar panel on the roof tile/roof slate/wall plate is achieved if numerous micro containers (micropheres), containing glue, are attached to the surface of the extensions. These micro containers may contain as one part a first component and as second part a second component of a two component adhesive.

A particularly good bond and optimal hold of the photovoltaic elements in the frame of the solar panel is achieved if a non-metallic, elastic material, particularly silicone, is applied between the photovoltaic element and the frame. The silicone will build a watertight seal after curing. The silicone will form a chemical compound with the glass of the photovoltaic element and with the synthetic material, particularly silicone, of the frame. This results in an unbreakable bond which protects the solar cells from the infiltration of corrosive atmospheres.

Chamfering of the solar panel's glass pane and an overlapping of the curable synthetic material, particularly silicone, provides a special protection of the edges of the hardened glass panes, which are particularly sensitive to breakage.

The frame forms a level plane with the glass pane. With this design, rain water can run off smoothly without obstruction and without dirt particles being able to collect on the edges of the solar panel. The transparency of the solar panel's glass pane remains intact and long-term cleanliness is maintained. Cleaning of the solar panel is not necessary.

Simple and secure wiring is achieved if a cable support, fastened, particularly joined, to the solar panel, protrudes downwards on the bottom side of the solar panel.

The roofing element photovoltaic system according to the invention features a number of significant advantages. The roofs can initially be covered in a conventional manner. The solar panels can be pressed into the roof tiles at a later date and anchored in a non-slipping manner; the energy supply can be constructed successively, all without the need to uncover or change the roof.

It is particularly advantageous if a profile is fastened to at least one but preferably two opposite sides of the solar panel, with said profile featuring at least one flexible blade pointing downwards, and with the end of the blades forming the extensions that snap into at least one recess of the indent of the roof tile/roof slate/wall plate. This ensures a secure hold of the solar panel even over long periods, especially if the profile is made of stainless steel or aluminum.

Destructive warping of the solar cells is absolutely prevented if one of the measures according to claims 25 to 28 is provided.

Further details and advantageous refinements of the invention are set forth in the following description and associated drawings of the preferred embodiment, of which

Figure 1:
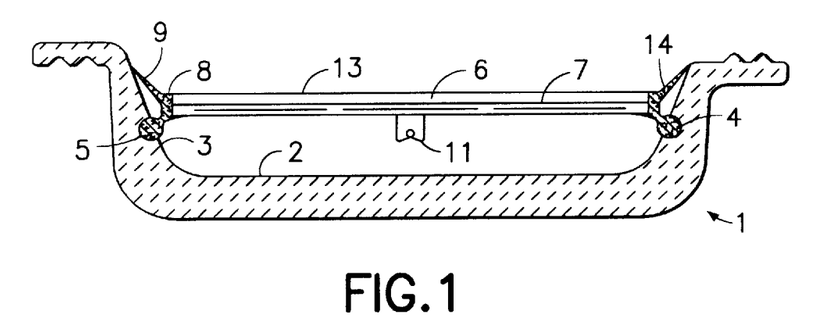
FIG. 1 is a section through a roof tile/roof slate.

A roof tile/roof slate/wall plate, in the following called roof tile 1, is made of clay, ceramic, concrete or synthetic and features, as illustrated in FIG. 1, an indent 2 that is open on the top, giving the roof plate a wide U-shaped cross section with its free ends being bent towards the outside to create the traditional interlocking rabbet overlaps.

Individual recesses 4 are placed on the sides, in the inner edges 3 of the indent 2, with extensions 5 of the solar panel 6 engaging in these recesses. Thus, the solar panel 6 covers the top side of the indent 2 in its entirety. The solar panel 6 is made with solar cells (photovoltaic elements) 7 surrounded by a frame 8.

Figure 2:
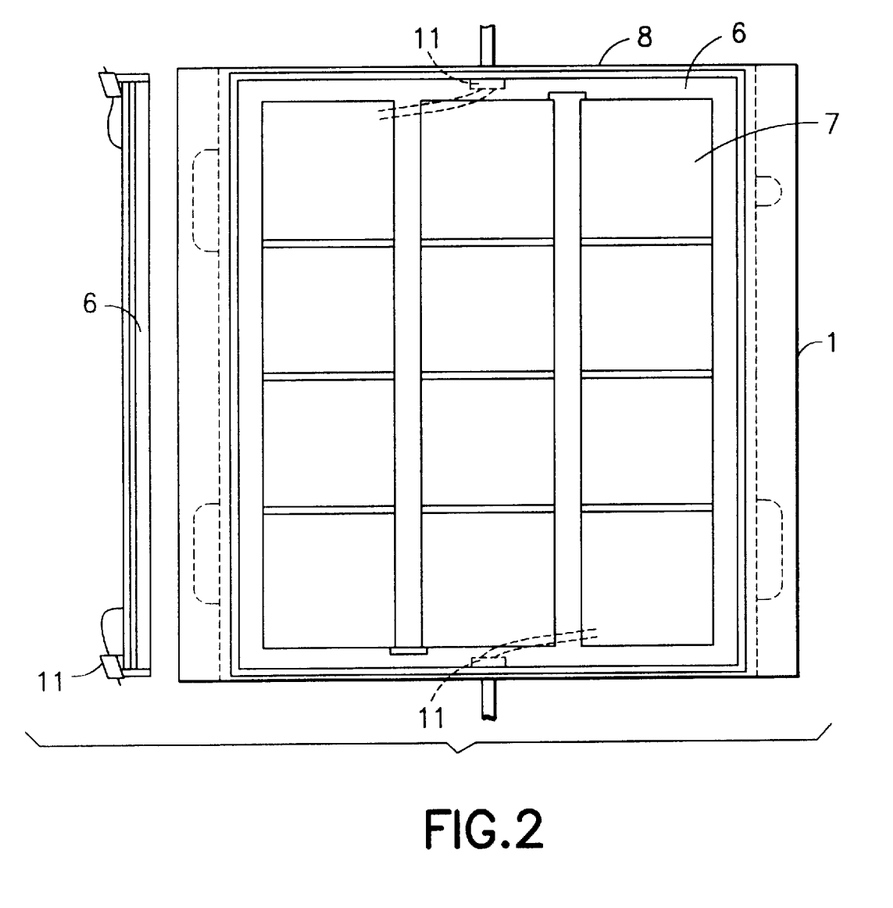
FIG. 2 is a top view and a side view of the roof tile/roof slate/wall plate.

The extensions 5, made of a soft material, particularly of a soft synthetic (silicone), are joined to the two longitudinal sides on the outside of the rectangular frame 8, as illustrated in FIGS. 1 and 2. The frame 8 can be made of the same material. The extensions 5 do not cover the entire length of the side edge of frame 8, rather each side of the frame features two or more individual extensions 5 that engage form-fittingly in correspondingly shaped individual recesses of the inner edges or inner side walls.

In this manner, the recesses 4 have a length that is only a fraction of the entire length of the inner edge 3. These recesses 4 may be groove sections, longitudinal holes, pockets, and/or bore holes.

Figure 3:
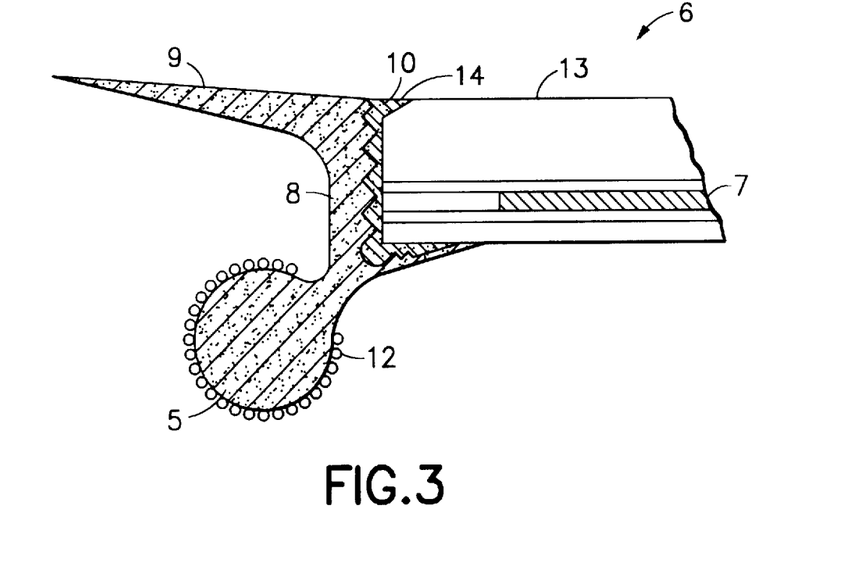
FIG. 3 is a section through the side edge of the solar panel in the region of an longitudinal side.

The extensions 5, protrude, as illustrated in FIG. 3, at the bottom edge in a downwards bevelled fashion with an angle of approx. 45 degrees such that the frame 8 is on the roof tile 1 at such a height, that there is no indent above the solar panel, or only a slight indent. With such a design, shading of the solar panel by the edge of the roof tile is negligible ensuring light incidence even when the sun is at a low angle.

The special design of extensions 5 underneath the solar panel 6 creates a spring/clamp effect to secure the solar panel 6 to the roof tile.

A longitudinal rabbet profile 9 protrudes to the side in an approximate horizontal manner at the upper edge of the frame 8 and butts tightly with the inner edge 3. Numerous micro containers 12, containing glue, may be attached to the surface of the extensions 5. These micro containers may contain as one part a first component and as second part a second component of a two component adhesive such that when pressing the extension 5 into the recess 4, the micro containers burst, their contents mix and form a fast hardening adhesive.

Located between the photovoltaic elements or solar cells 7 and the frame 8 is a non-metallic, elastic material, particularly a synthetic (silicone) 10 that will, after curing, form a watertight connection between these parts at their edges and form a chemical compound with these edges.

A particularly good bond between the frame 8 and the solar panel 6 is achieved when the upper edge 14 of the solar panel's 6 glass pane 13, the one pointing to the light, is chamfered such that the chemically reacting synthetic (silicone) 10 reaches over the glass pane resulting in a stronger bond between the frame 8 with the solar panel 6.

An additional advantage of this arrangement with the synthetic 10 reaching over the edge of the glass pane 13 is the protection of these edges from mechanical and chemical attack. This is especially important, because the glass pane is hardened and particularly sensitive to shock.

This frame structure 8–10 allows for rain water to run off without obstruction, preventing dirt-forming particles from being deposited on the edges. This is a significant advantage over all known solar-panel frames.

Figure 4:
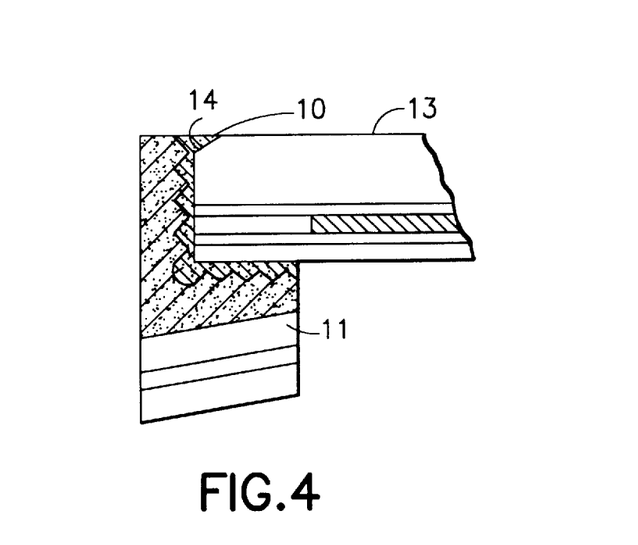
FIG. 4 is a section through the side edge of the solar panel in the region of the narrow side with the joined cable support.

Protruding downwards, a cable support 11 is joined to the frame 8 at the bottom side of the solar panel 6, as illustrated in FIGS. 2 and 4. One cable support each is located on the bottom narrow side and on the top narrow side of the solar panel 6.

Figure 5:
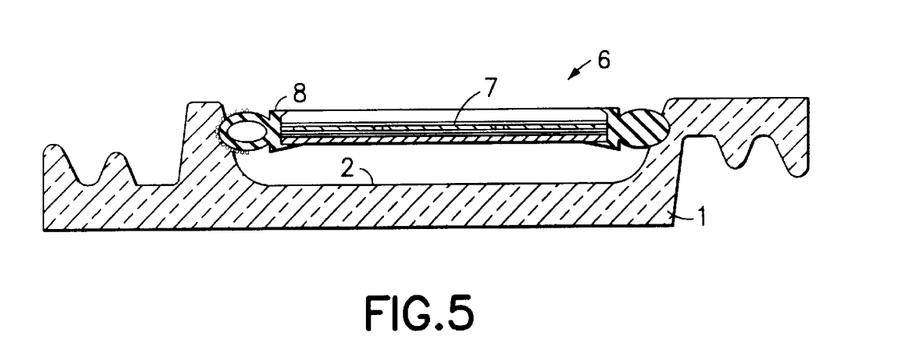
FIG. 5 is a section through the side edge of the solar panel in the region of the narrow side with the joined cable support.
Figure 6:
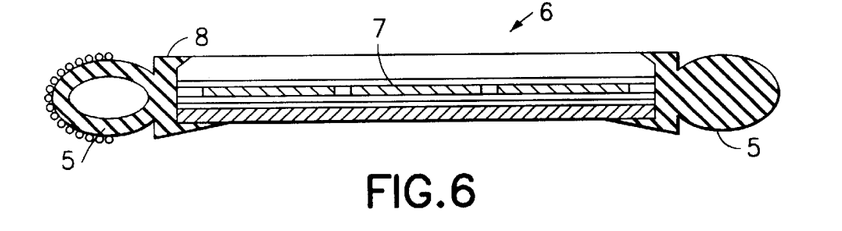
FIG. 6 is a section through the solar panel according to FIG. 5.
Figure 7:
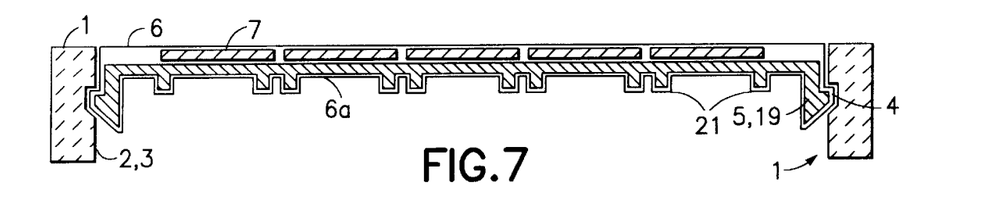
FIG. 7 is a section through an embodiment where the carrier plate of the solar panel forms the flexible extensions on the side of the solar panel.

The embodiment illustrated in FIGS. 5 and 6 deviates from the embodiment shown in FIGS. 1 through 4 such that the extensions 5 have a cambered exterior shape with a horizontal main axis (longitudinal axis). These extensions are particularly flexible if they are made of a very soft material such as moss rubber, and/or if they are hollow on the inside (hollow body, hollow profile), as shown on the left side of FIGS. 5 and 6. In one special embodiment, the extensions have an oval sectional shape.

Figure 11:
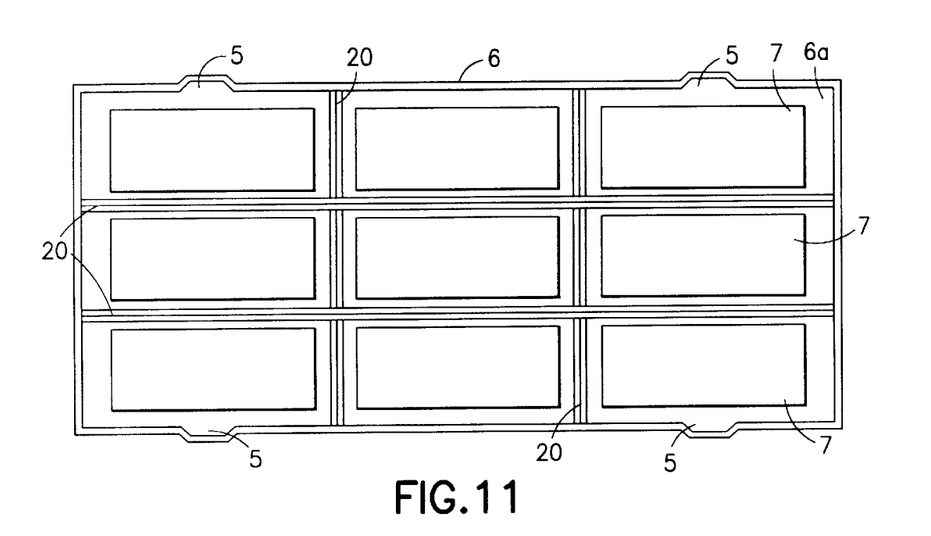
FIG. 11 is the upper side of the third or fourth embodiment with weakening recesses.

As illustrated in FIG. 11, the carrier plate 6a of the solar panel may be made of a flexible material from which hook-shaped parts 5 or extensions or tongues protrude on each side that snap into the recesses 4 of the roof tile/roof slate or the wall plate.

By pressing in the polymer pv. module, the flexible hooks are bent towards the inside over the adaption geometry and then engage in the corresponding indents in the roofing elements.

Figure 12:
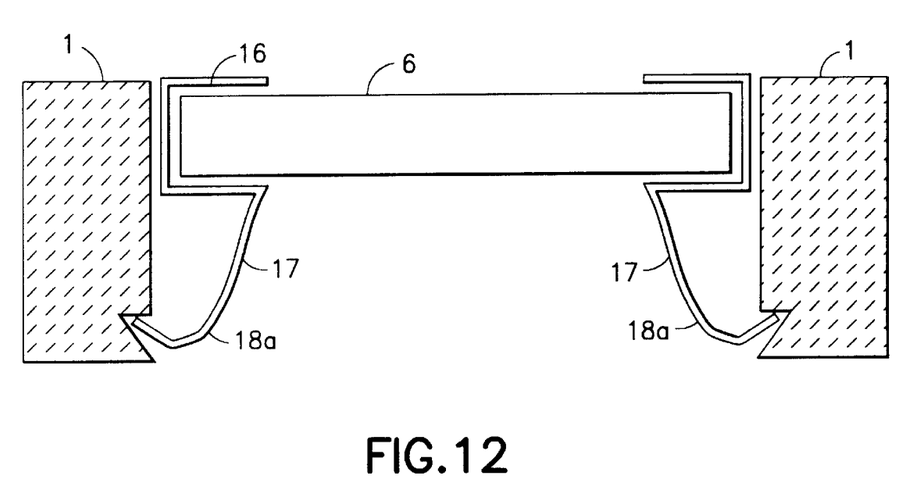
FIG. 12 is a section through a roof tile/roof slate/wall plate with deflecting holding profiles or brackets.

Over the length of the appendage, particularly through a bent elastic area (18a) (FIG. 12), the spring distance of the snap-in connection is determined; over the bending points, the curvature of the polymer pv. module is created.

The ribbing keeps the bending forces away from the solar cells. Initial tension in the roofing element is created by a slightly larger size of the carrier plate in the roofing element.

Through the geometry of the snap-in connection in combination with the weak bending points, the pv. module's curvature will always point upwards because of this slightly larger size.

The solar cells are mounted on a carrier plate (6a) made of ceramic, concrete or glass reinforced with glass fiber or glass spheres, as illustrated in FIGS. 7, 8, 9, 10. As illustrated in FIG. 11, notches 20 are worked into the carrier plate 6a between the solar cells such that the carrier plate can be bent at these weaker points 20 without the bending forces bending the solar cells in a damaging manner. Bending of the solar cells is also prevented by the torsion-proof ribbing 21 located underneath the solar cells. The thickness of the carrier plate between the solar cells is small enough that the carrier plate can be bent (curvature towards the inside).

Figure 8:
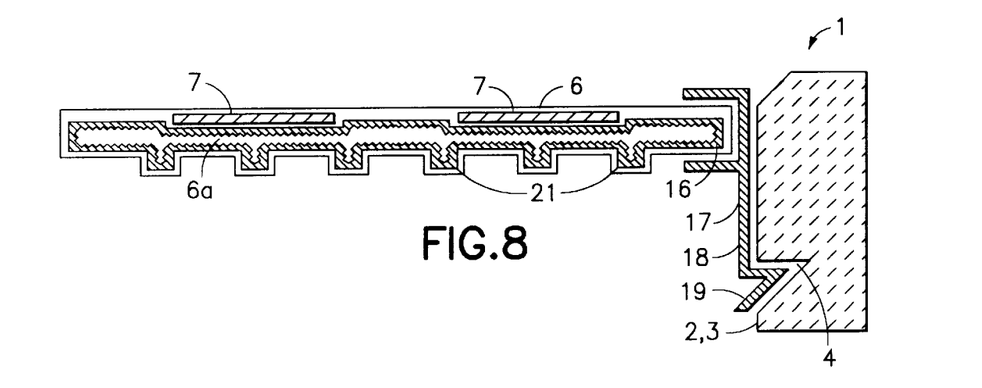
FIG. 8 is a section through the roof tile/roof slate/wall plate in a third embodiment with holding profiles made of metal.
Figure 9:
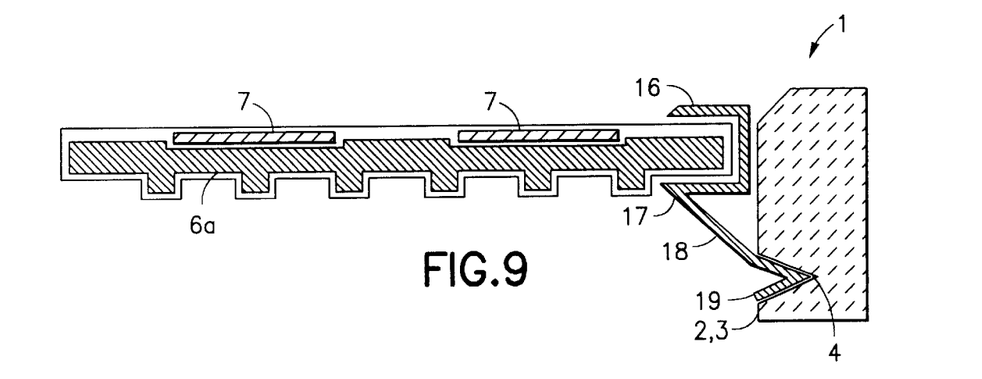
FIG. 9 is a section through the roof tile/roof slate/wall plate in a fourth embodiment with holding profiles made of metal.
Figure 10:
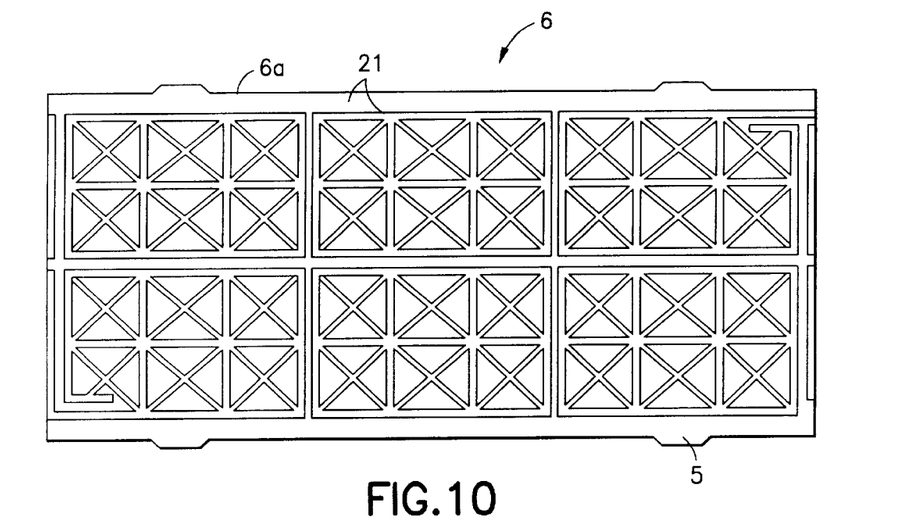
FIG. 10 is the bottom side of the third or fourth embodiment with bracing ribs.

Profiles 17 are, according to FIGS. 8 and 9, fastened to at least one but preferably two opposite sides of the solar panel, with said profiles featuring at least one flexible blade 18 pointing downwards with the end of the blades forming the extensions 19 that snap into at least one recess of the indent of the roof tile/roof slate/wall plate. Thus, adaptation tongues are or flexible hooks, particularly profiles are attached as snap-in fasteners that engage in the recesses of the roof tile upon bending. When the bending relaxes, the polymer module remains attached to the roof tile under a small tension. The profile 17 features in its upper region a recess, particularly a longitudinal groove (longitudinal channel) 16 where the side edge of the solar panel is form-fittingly inserted. The profile 17 is made of metal having a high strength-to-weight ratio, particularly of stainless steel or aluminum. In one special embodiment, the flexible blade 18 covers either the entire length or only a short distance of the entire length of the solar panel.

The tongues 5 are designed such that they can deflect as the module is pressed in. The slight tension of the carrier plate, combined with a slight curvature adjusts for tolerances in the roof tile. Torsion tolerances among the adaptation grooves can be corrected through slight twisting of the carrier plate. The blue annealed V4A spring element 17, 18, 19 engages in the adaptation geometry of the roof tile/roof slate. The spring element is pushed into indentations of the carrier plate and locked in position by the subsequent laminating process.

Figure 13:
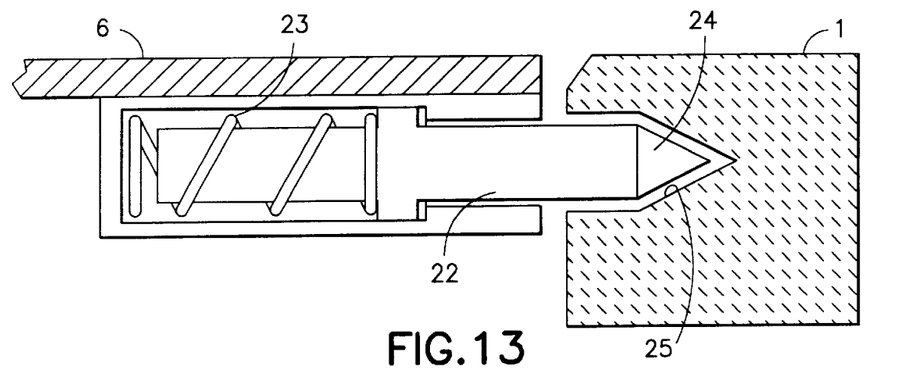
FIG. 13 is a section through the fastening region with spring pin elements.
Figure 14:
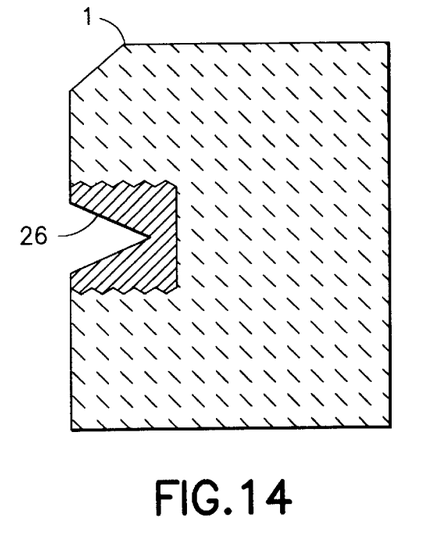
FIG. 14 is a section through the fastening section with inserted adapter bushings.

Instead of or in addition to the spring elements 17, 18, 19, spring pin elements 22 may be attached to the solar panel, as illustrated in FIGS. 13 and 14, where said spring pin elements are loaded by a compression spring 23 and their front pointed tip 24 engages in the correspondingly shaped recess 25 of the roof tile/roof slate/wall plate. The recess 25 may be made from a bearing part 26, particularly in shape of a bushing made of metal or synthetic and be cast, pressed or glued into the material of the roof tile/roof slate/wall plate. This presents an especially secure hold regardless of the material of the roof tile/roof slate/wall plate.

Roof tiles made of clay are burnt and have tolerances in all directions due to the production process. These tolerances are adjusted for through the design of the carrier plate. The carrier plate with the solar cells is hermetically sealed in fluoro-polymer resin. An unbreakable chemical and mechanical bond between the carrier material and the solar cells is achieved through adhesive agents and holes in the carrier plate.

In its outer region, the sheeting of the cable is made of the same polymer as the one enclosing the module. This ensures a mechanically tear-proof and weather-resistant, corrosion-proof electrical connection.

The following features are particularly advantageous at this roof tile/roof slate/wall plate:

The synthetic enclosing the solar panel 6 is a fluoro-polymer. Using an adhesive agent, the polymer synthetic is chemically joined with the carrier material. The polymer synthetic may be joined mechanically with the carrier material by through-holes, indentations, or bore holes.

The tongues of the carrier plate engage in the adaptation geometry of the roof element such that a slight tension curvature adapts the pv. module to the roof tile such that production tolerances of the roofing element in the longitudinal, horizontal and torsion planes are adjusted for. The adaptation geometry of the carrier plate is thus a flexible construction (snap-in connection).

The electrical wiring consists of three components: a cable, a first sheeting made of a high-temperature resistant polymer, and a second sheeting made of the same polymer as the one enclosing the module. In this manner, the cable is hermetically sealed into the pv. module and mechanically stable. The electrical cable can be attached to a U-shaped guide channel. Wiring of the solar panel is carried out on the back side of the carrier plate, particularly in printed circuit technology.

I claim:

1. Roof tile/roof slate/wall plate made of a plate of clay, ceramic, concrete, fiber cement or synthetic, formed with a plurality of recesses, in combination with a solar panel (6) with photovoltaic solar cells to be attached to its upper side, wherein said solar panel (6) is attached form-fittingly to the upper side of the roof tile/roof slate/wall plate with at least two sides opposite to one another at the inner edges of a recess of an indent of a roof tile/roof slate/wall plate, flexible extensions (5, 19) are positioned on the side of the solar panel, and the extensions (5, 19), due to their own flexibility, engage in a snap-in manner, in recesses (4) of the roof tile/roof slate/wall plate indentation (2).

2. Roof tile/roof slate/wall plate according to claim 1, wherein the solar panel (6) features on each of two sides opposite to one another two or more individual extensions (5) that rest form-fittingly in correspondingly shaped individual recesses (4) of the inner edges (3).

3. Roof tile/roof slate/wall plate according to claim 1, wherein the recesses (4) engage at a bottom side edge of the roof tile/roof slate/wall plate.

4. Roof tile/roof slate/wall plate according to claim 1, wherein the extensions (5) are made of an elastic material.

5. Roof tile/roof slate/wall plate according to claim 1, wherein the recesses (4) have a length that is a fraction of the entire length of the inner edge (3).

6. Roof tile/roof slate/wall plate according to claim 1, wherein the recesses (4) have a shape selected from the group consisting of groove sections, longitudinal holes, pockets, and bore holes.

7. Roof tile/roof slate/wall plate according to claim 1, wherein the extensions (5) are carried by a frame surrounding the solar panel (6).

8. Roof tile/roof slate/wall plate according to claims 1, wherein the extensions (5) protrude at the bottom side of the solar panel in a downwardly bevelled fashion.

9. Roof tile/roof slate/wall plate according to claim 1, wherein a longitudinal rabbet profile (9) protrudes to a side at an upper edge of the frame (8) and butts tightly with the roof tile/roof slate/wall plate (1).

10. Roof tile/roof slate/wall plate according to claim 1, wherein a plurality of microcontainers (12) containing glue are attached to a surface of the extensions (5).

11. Roof tile/roof slate/wall plate according to claim 10, wherein the micro containers (12) contain as one part a first component, and as second part, a second component of a two component adhesive.

12. Roof tile/roof slate/wall plate according to claim 1, wherein a non-metallic, elastic material (10), is applied between the photovoltaic element (7) and the frame (8) and this material builds a watertight seal after curing.

13. Roof tile/roof slate/wall plate according to claim 1, wherein a cable support (11) is fastened, to the solar panel and protrudes downwards on the underside of the solar panel (6).

14. Roof tile/roof slate/wall plate according to claim 1, wherein the frame (8) is in line with a glass pane (13) of the solar panel (6), and where edges of the glass pane (13) pointing to the sun are chamfered all around.

15. Roof tile/roof slate/wall plate according to claim 1, wherein the extensions (5) form part of a hollow body, made of an elastic material.

16. Roof tile/roof slate/wall plate according to claim 1, wherein the extension has an oval cross section.

17. Roof tile/roof slate/wall plate according to claim 1, wherein a section of a profile (17) is fastened to two opposite sides of the solar panel, with said profile featuring at least one flexible blade (18) pointing downwards with the end of the blades forming the extension(s) (19) that snap into at least one recess of the roof tile/roof slate/wall plate indent.

18. Roof tile/roof slate/wall plate according to claim 1, wherein the flexible blade (18) features a bent spring region (18a) to adjust for tolerances.

19. Roof tile/roof slate/wall plate according to claim 1, wherein the profile (17) features in its upper region a recess, (16) into which the side edge of the solar panel engages.

20. Roof tile/roof slate/wall plate according to claim 1, wherein the elastic blade (18) covers at least a short portion of the length of the solar panel.

21. Roof tile/roof slate/wall plate according to claim 1, wherein the profile (17) is made of a metal having a high strength-to-weight ratio.

22. Roof tile/roof slate/wall plate according to claim 1, wherein the extensions attached to the solar panels comprise spring-loaded pins (22).

23. Roof tile/roof slate/wall plate according to claim 1, wherein outer edges (24) of pins (22) are shaped in a way which matches the inner shape of recess (4) of the roof tile/roof slate/wall plate.

24. Roof tile/roof slate/wall plate according to claim 1, wherein the recesses (4) of the roof tile/roof slate/wall plate are made from a bearing part, and are cast, pressed or glued into the material of the roof tile/roof slate/wall plate.

25. Roof tile/roof slate/wall plate according to claim 1, wherein a carrier plate portion (6a) of the solar panel (6) is made of glass.

26. Roof tile/roof slate/wall plate according to claim 1, wherein the carrier plate of the solar plate features protruding ribs (21) on a bottom side thereof to make the region of the solar cells (7) more rigid.

27. Roof tile/roof slate/wall plate according to claim 1, wherein the bottom side is free of ribs in a region of spaces between the solar cells (7).

28. Roof tile/roof slate/wall plate according to claim 1, wherein weakening notches (20), are formed in the carrier plate (6a) in the region of the spaces between the solar cells (7).

29. A solar panel (6), comprising a generally rectangular base plate (6a), a plurality of photovoltaic cells (7) secured to an upper surface of said base plate, a frame (8) surrounding said plurality of photovoltaic cells (7), and at least two extensions (5) of a resilient material protruding from each of at least two opposing sides of said solar panel, out of a plane defined by said rectangular base plate, in a direction away from said upper surface bearing said photovoltaic cells (7).

* * * * *

UNITED STATES PATENT AND TRADEMARK OFFICE
CERTIFICATE OF CORRECTION

PATENT NO. : 5,768,831
DATED : Jun. 23, 1998
INVENTOR(S) : Melchior

It is certified that error appears in the above-identified patent and that said Letters Patent is hereby corrected as shown below:

In column 4, line 7 "solar-panel" should be --solar panel--.

In column 6, line 28, claim 8, "claims" should be --claim--.

Signed and Sealed this

Sixteenth Day of February, 1999

Attest:

Attesting Officer

Acting Commissioner of Patents and Trademarks